United States Patent
Nomura et al.

(10) Patent No.: US 6,674,511 B2
(45) Date of Patent: Jan. 6, 2004

(54) EVALUATION MASK, FOCUS MEASURING METHOD AND ABERRATION MEASURING METHOD

(75) Inventors: Hiroshi Nomura, Kawasaki (JP); Kenji Konomi, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 272 days.

(21) Appl. No.: 09/923,443

(22) Filed: Aug. 8, 2001

(65) Prior Publication Data

US 2002/0021434 A1 Feb. 21, 2002

(30) Foreign Application Priority Data

Aug. 9, 2000 (JP) .......................... 2000-241480

(51) Int. Cl.[7] .................. G03B 27/52; G03B 27/68; G03B 27/54; G03F 00/09
(52) U.S. Cl. .................. 355/55; 355/52; 355/67; 430/5; 430/311
(58) Field of Search ................ 355/53, 55, 52, 355/67, 77; 430/5, 20, 311; 356/624, 399, 123

(56) References Cited

U.S. PATENT DOCUMENTS

| | | | |
|---|---|---|---|
| 4,908,656 A | | 3/1990 | Suwa et al. |
| 5,300,786 A | | 4/1994 | Brunner et al. |
| 5,789,118 A | * | 8/1998 | Liu et al. .................. 430/5 |
| 5,948,571 A | | 9/1999 | Mih et al. |
| 6,011,611 A | * | 1/2000 | Nomura et al. ............ 355/67 |
| 6,091,486 A | * | 7/2000 | Kirk .......................... 356/124 |
| 6,114,096 A | | 9/2000 | Mih et al. |
| 6,130,747 A | | 10/2000 | Nomura et al. |
| 6,171,739 B1 | * | 1/2001 | Spence et al. .............. 430/30 |
| 6,310,679 B1 | * | 10/2001 | Shiraishi ..................... 355/53 |

OTHER PUBLICATIONS

T.A. Brunner et al., "Quantitative Stepper Metrology Using the Focus Monitor Test Mask", Optical/Laser Micolithography VII, Timothy A. Brunner ed., Proc. SPIE, vol. 2197, pp 541–549 (1994).

J.P. Kirk et al., "Application of Blazed Gratings for Determination of Equivalent Primary Azimuthal Aberrations", Optical Microlithography XII, Luc Van den Hove ed., Proc. SPIE vol. 3679, 70–76 (1999).

Kirk, "Astigmatism and field curvature from pin–bars," Mar. 6–8, 1991, SPIE, 1463:282–291.

* cited by examiner

*Primary Examiner*—Russell Adams
*Assistant Examiner*—D. Ben Esplin
(74) *Attorney, Agent, or Firm*—Finnegan, Henderson, Farabow, Garrett & Dunner, L.L.P.

(57) ABSTRACT

An evaluation mask for evaluating a projection-type exposure apparatus, the mask including at least one diffraction grating pattern for producing a diffracted light of the positive first-order and a diffracted light of negative first-order, diffraction efficiencies of the diffracted lights being different respectively, one of the diffracted lights having a magnitude that is zero, and an image of the at least one diffraction grating pattern being projected onto a test substrate by the projection-type exposure apparatus, and a reference pattern for obtaining a reference image to measure a displacement of the image of the diffraction grating pattern, and an image of the reference pattern being projected onto the test substrate or the image detector by the projection-type exposure apparatus, wherein the images of the diffraction grating pattern and the reference pattern projected onto the test substrate or the image detector are used for evaluating the projection-type exposure apparatus.

23 Claims, 14 Drawing Sheets

$|\phi 1 - \phi 2| = 90°$ $|\phi 1 - \phi 2| = 90°$    W0:W1:W2=2:1:1

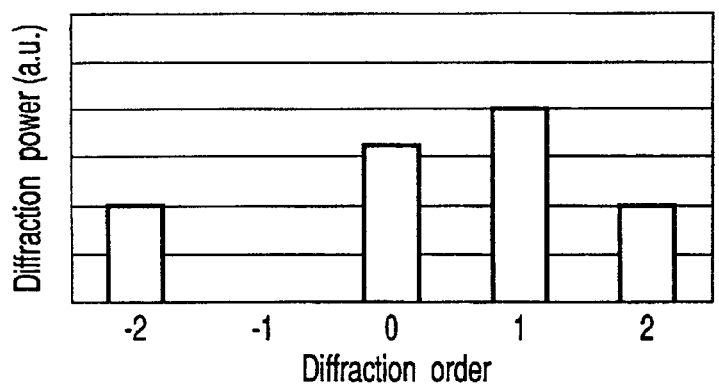
FIG. 11
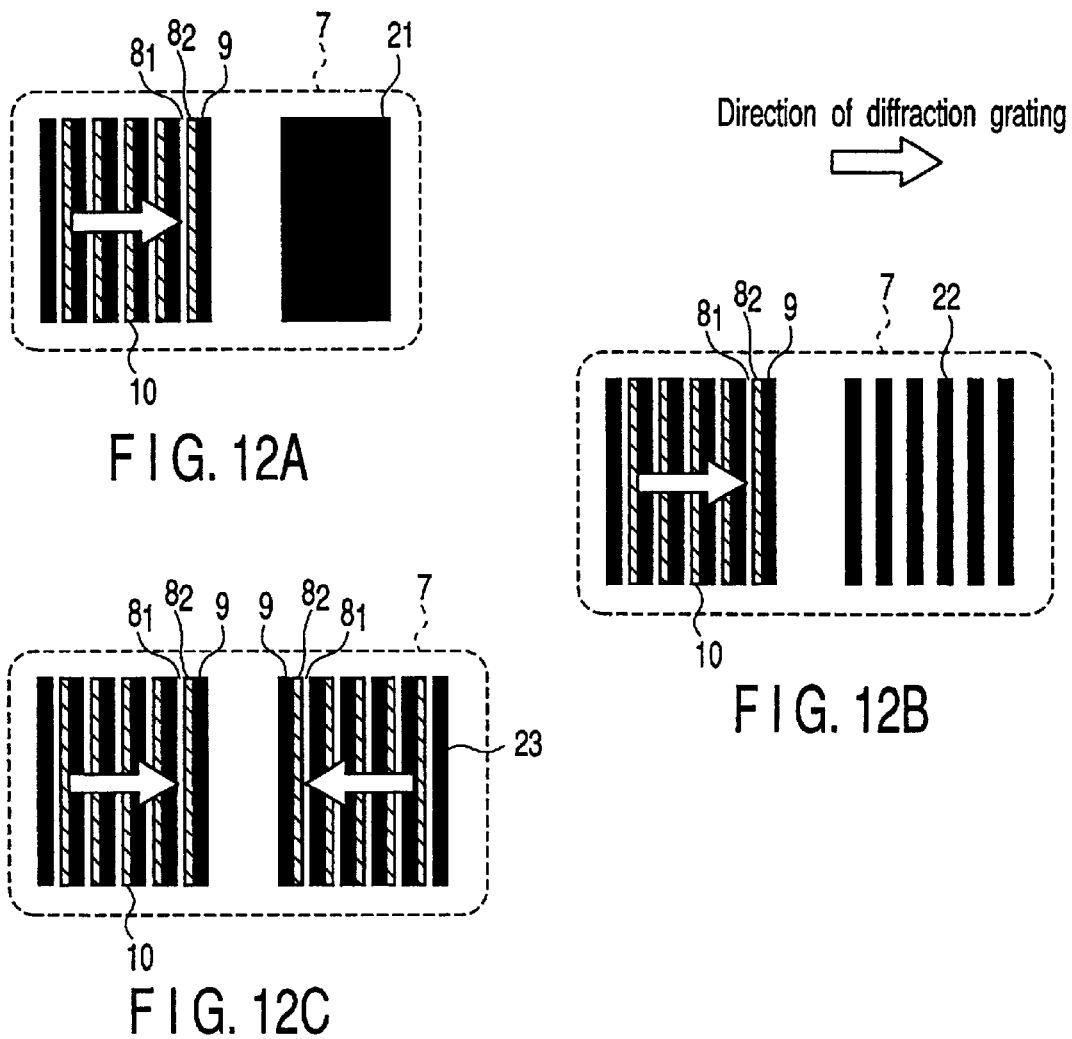
FIG. 12A
FIG. 12B
FIG. 12C

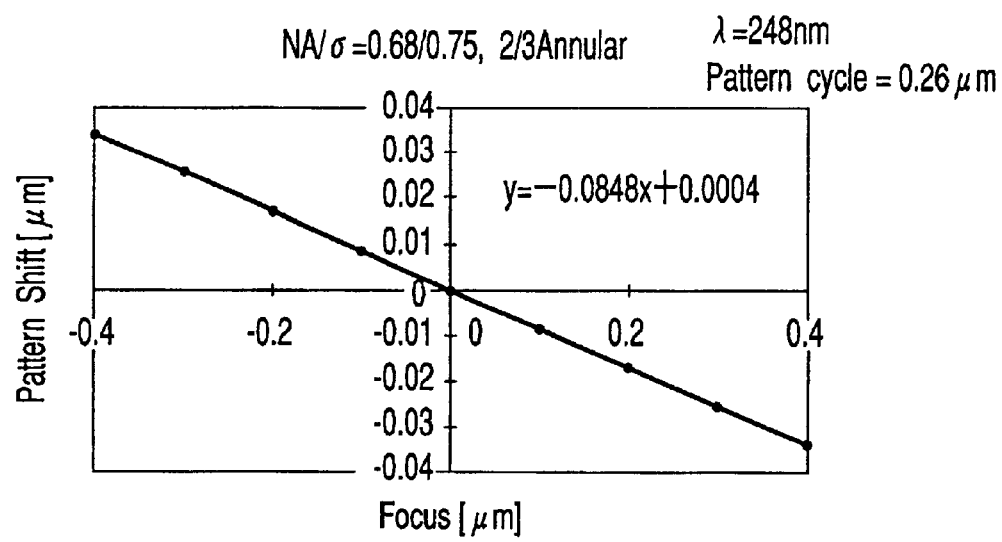
F I G. 16
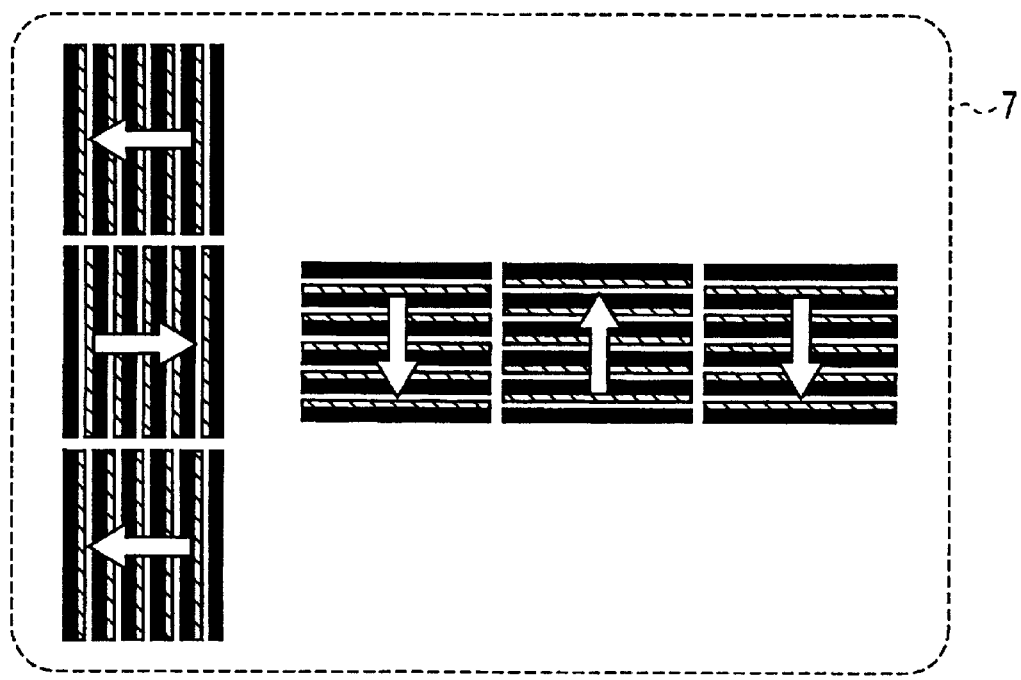
F I G. 17

Mask pattern

Mask pattern

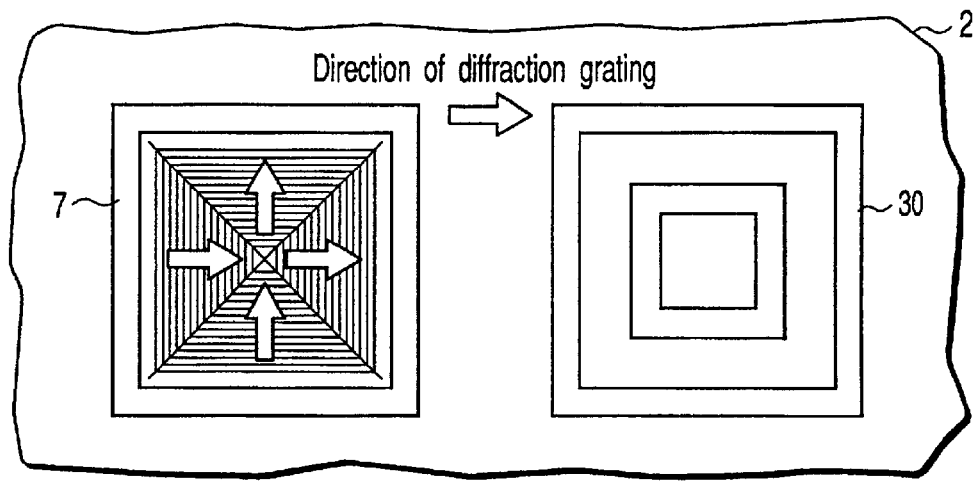
FIG. 20
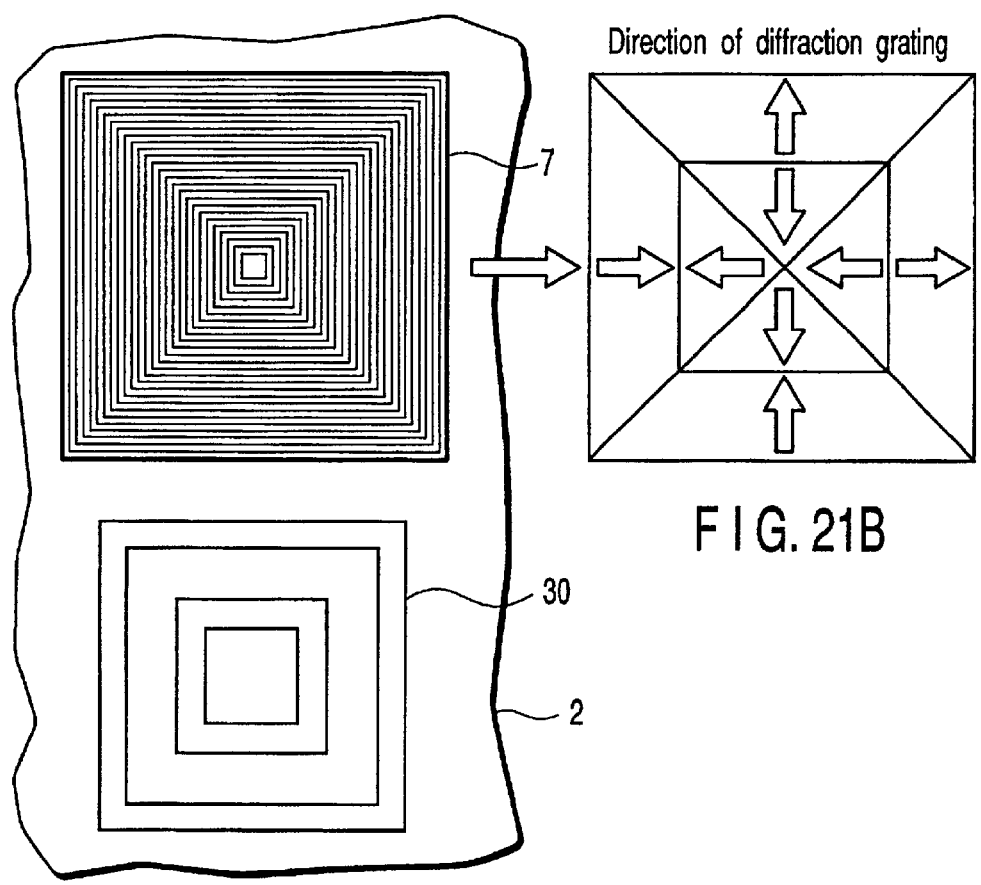
FIG. 21B
FIG. 21A

Mask pattern

Resist pattern $P = \lambda/\{NA(1-\sigma)\}$ $P = 2\lambda/\{NA(1+\sigma)\}$

EVALUATION MASK, FOCUS MEASURING METHOD AND ABERRATION MEASURING METHOD

CROSS-REFERENCE TO RELATED APPLICATIONS

This application is based upon and claims the benefit of priority from the prior Japanese Patent Application No. 2000-241480, filed Aug. 9, 2000, the entire contents of which are incorporated herein by reference.

BACKGROUND OF THE INVENTION

1. Field of the Invention

This invention relates to an evaluation mask, a focus measuring method and an aberration measuring method that are used in the field of semiconductor technologies.

2. Description of the Related Art

As a design rules for semiconductor devices to be manufactured have been miniaturized in recent years, a focus margin of a lithography process have been reduced. Therefore, the specifications of a surface flatness of a wafer and a field curvature of exposure apparatus have become more and more rigorous. By the same token, high precision techniques have been required for focus measuring methods and field plane curvature measuring methods using a resist pattern transferred on the wafer.

Conventionally, the methods described in U.S. Pat. No. 4,908,656 (to be referred to as USP1) and U.S. Pat. No. 5,300,786 (to be referred to as USP2) are used as focus measuring methods using a resist pattern along with other methods realized by applying either or both of them.

With the USP1 method, a rhombic pattern formed on a mask is transferred onto a wafer and the focus is measured by using the phenomenon that the transferred pattern shows a maximal size at the best focus. Conventionally this method is called SMP.

With the USP2 method, on the other hand, a so-called Levenson type alternating phase shift mask is used to expose to light an isolated stripe type shield pattern that is designed to show a phase difference other than 180° (optimally 90°) between the opposite ends thereof. Then, the image of the isolated stripe type shield pattern moves transversally when it is exposed to light at positive or negative defocus. The method utilizes this phenomenon for the purpose of measuring the focus.

The USP1 method can be applied not only to the focus measuring method of the isolated pattern but also a focus measuring method of a variety of periodic patterns. For example When the variety of periodic patterns includes two pairs of rhombic patterns which differ in size or two pairs of periodic patterns which intersect each other with an acute angle is formed by double exposures, the focus of the variety of periodic patterns can be measured by changing the period.

On the other hand, the USP2 method provides the advantage that the defocus with the proper (negative or positive) sign can be measured by a single exposure because the isolated stripe pattern moves substantially linearly relative to the best focal point.

BRIEF SUMMARY OF THE INVENTION

A evaluation mask for evaluating a projection-type exposure apparatus, the mask according an aspect of the present invention comprises at least one diffraction grating pattern for producing a diffracted light of the positive first-order and a diffracted light of negative first-order, diffraction efficiencies of the diffracted lights being different respectively, one of the diffracted lights having a magnitude that is substantially zero, and an image of the at least one diffraction grating pattern being projected onto a test substrate or an image detector by the projection-type exposure apparatus; and a reference pattern for obtaining a reference image to measure a displacement of the image of the at least one diffraction grating pattern, and an image of the reference pattern being projected onto the test substrate or the image detector by the projection-type exposure apparatus, wherein the images of the at least one diffraction grating pattern and the reference pattern projected onto the test substrate or the image detector are used for evaluating the projection-type exposure apparatus.

A evaluation mask for evaluating a projection-type exposure apparatus, the mask according an aspect of the present invention comprises at least one diffraction grating pattern for producing a diffracted light of the positive first-order and a diffracted light of negative first-order, diffraction efficiencies of the diffracted lights being different respectively, one of the diffracted lights having a magnitude that is substantially zero, the at least one diffraction grating pattern comprising a light-shield section for shielding light and first and second transparent sections for transmitting light, the absolute value of the difference between a phase of light transmitted through the first transparent section and a phase of light transmitted through the second transparent section being 90°, and an image of the at least one diffraction grating pattern being projected onto a test substrate or an image detector by the projection-type exposure apparatus; and a reference pattern for obtaining a reference image to measure a displacement of the image of the at least one diffraction grating pattern, and an image of the reference pattern being projected onto the test substrate or the image detector by the projection-type exposure apparatus, wherein the images of the at least one diffraction grating pattern and the reference pattern projected onto the test substrate or the image detector are used for evaluating the projection-type exposure apparatus.

A focus measuring method for measuring a defocus of an image of a test mark formed on a focus test mark projected on a substrate, the image being projected by a projection-type exposure apparatus, the projection-type exposure apparatus projecting an image of a mask pattern formed in a photomask onto the substrate by way of a projection optical system comprises preparing an evaluation mask as the focus test mark, the evaluation mask comprising: at least one diffraction grating pattern for producing a diffracted light of the positive first-order and a diffracted light of negative first-order, diffraction efficiencies of the diffracted lights being different respectively, one of the diffracted lights having a magnitude that is substantially zero, and a reference pattern for obtaining a reference image to measure a displacement of the image of the at least one diffraction grating pattern, preparing a substrate with a photo sensitizing material;

exposing the image of the diffraction grating pattern and the image of the reference pattern onto the substrate simultaneously, the diffraction grating pattern and the reference pattern comprising a test mark in the evaluation mask;

exposing an image of a trim pattern onto the substrate if the trim pattern exists in the evaluation mask; and measuring the relative distance of the image of the diffraction grating pattern formed on the substrate and the image of the reference image formed on the substrate.

A focus measuring method for measuring a defocus of an image of a test mark formed on a focus test mark projected on a substrate, the image being projected by a projection-type exposure apparatus, the projection-type exposure apparatus projecting an image of a mask pattern formed in a photomask onto the substrate by way of a projection optical system comprises preparing an evaluation mask as the focus test mark, the evaluation mask comprising: at least one diffraction grating pattern for producing a diffracted light of the positive first-order and a diffracted light of negative first-order, diffraction efficiencies of the diffracted lights being different respectively, one of the diffracted lights having a magnitude that is substantially zero, and a reference pattern for obtaining a reference image to measure a displacement of the image of the at least one diffraction grating pattern; and measuring the relative distance of the image of the diffraction grating pattern formed on the substrate and the image of the reference image formed on the substrate.

A focus measuring method for measuring a defocus of an image of a test mark formed on a focus test mark projected on a substrate, the image being projected by a projection-type exposure apparatus, the projection-type exposure apparatus projecting an image of a mask pattern formed in a photomask onto the substrate by way of a projection optical system comprises preparing an evaluation mask as the focus test mark, the evaluation mask comprising at least one diffraction grating pattern for producing a diffracted light of the positive first-order and a diffracted light of negative first-order, diffraction efficiencies of the diffracted lights being different respectively, one of the diffracted lights having a magnitude that is substantially zero, the at least one diffraction grating pattern comprising a light-shield section for shielding light and first and second transparent sections for transmitting light, the absolute value of the difference between a phase of light transmitted through the first transparent section and a phase of light transmitted through the second transparent section being 90°, and a reference pattern for obtaining a reference image to measure a displacement of the image of the at least one diffraction grating pattern; and measuring the relative distance of the image of the diffraction grating pattern formed on the substrate and the image of the reference image formed on the substrate.

An aberration measuring method for measuring an aberration of a projection-type exposure apparatus based on a defocus of an image of a test mark formed on a focus test mark projected on a substrate, the image being projected by the projection-type exposure apparatus, the projection-type exposure apparatus projecting an image of a mask pattern formed in a photomask onto the substrate by way of a projection optical system comprises preparing an evaluation mask as the focus test mark, the evaluation mask comprising: at least one diffraction grating pattern for producing a diffracted light of the positive first-order and a diffracted light of negative first-order, diffraction efficiencies of the diffracted lights being different respectively, one of the diffracted lights having a magnitude that is substantially zero, and a reference pattern for obtaining a reference image to measure a displacement of the image of the at least one diffraction grating pattern, preparing a substrate with a photo sensitizing material;

exposing the image of the diffraction grating pattern and the image of the reference pattern onto the substrate simultaneously, the diffraction grating pattern and the reference pattern comprising a test mark in the evaluation mask under the condition of $$\lambda/\{NA(1-\sigma)\} \leq P \leq 2\lambda/\{NA(1+\sigma)\},$$

where $\sigma$ is a partial coherence of a lighting optical system for lighting the test mark, P is a period of the image of the first pattern of the test mark, $\lambda$ is the wavelength of light of the lighting optical system and NA is a numerical aperture of the projection optical system;

exposing an image of a trim pattern onto the substrate if the trim pattern exists in the evaluation mask; and measuring the relative distance of the image of the diffraction grating pattern formed on the substrate and the image of the reference image formed on the substrate.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 11 shows a graph of a diffraction efficiency of a diffraction grating pattern according to an embodiment of the invention;

FIGS. 12A–12C show a test mark according to an embodiment of the invention;

FIG. 16 shows a graph of a result obtained by simulation of the relationship between the focus and the pattern shift when the test marks of FIGS. 15A–15C are used;

FIG. 17 is a schematic illustration of a test mark according to an embodiment of the invention;

FIG. 20 shows a test mark according to the second embodiment of the invention;

FIGS. 21A and 21B show an improvement example of the test mark shown in the FIG. 20;

DETAILED DESCRIPTION OF THE INVENTION

The inventors of the present invention have found that the methods disclosed in USP1 and USP2 are accompanied by the following problems.

With the method of USP1, the best focus is determined as a condition that a size of a transferred rhombic pattern becomes largest (maximum), so it is needed to change the focus condition gradually and an exposure process has to be repeated to observe a change of the size.

Therefore, the measurement errors caused by the fluctuations related to control of a focus of an exposure apparatus such as accuracy of the focus or intensity uniformity of exposure light, with the method of USP1, it is difficult to accurately measure the focus.

Additionally, with the method of USP1, even if the relationship between the size and the focus is predefined, a change of the size occurs substantially symmetrically in both the positive and negative directions of defocus, therefore, the value of defocus and the direction of defocus cannot be determined simultaneously unless exposure processes under at least two different conditions are performed. In other words, with the method of USP1, it is difficult to measure the defocus with the proper (positive or negative) sign in a simple manner.

On the other hand, with the method of USP2, the object under the measurement is limited to an isolated type pattern so that the pattern cannot be expanded to a periodic pattern. In other words, the method of USP2 is accompanied by the problem that it cannot observe a periodic pattern showing a pattern density similar to that of a pattern to be actually used for manufacturing semiconductor devices.

Additionally, with the method of USP2, it is a prerequisite for accurate measurement of the defocus that the defocus and the positional displacement of the isolated type pattern show a linear relationship. However, in reality, the relationship is not linear because of spherical aberration, astigmatism and other effects. Therefore, with the method of USP2, it is difficult to perform accurately measurement of the focus.

Before describing embodiments of the invention, the focus measuring methods of USP1 and USP2 will be described by referring to the accompanying drawing in order to clarify the difference between the present invention and the prior art.

Figure 1:
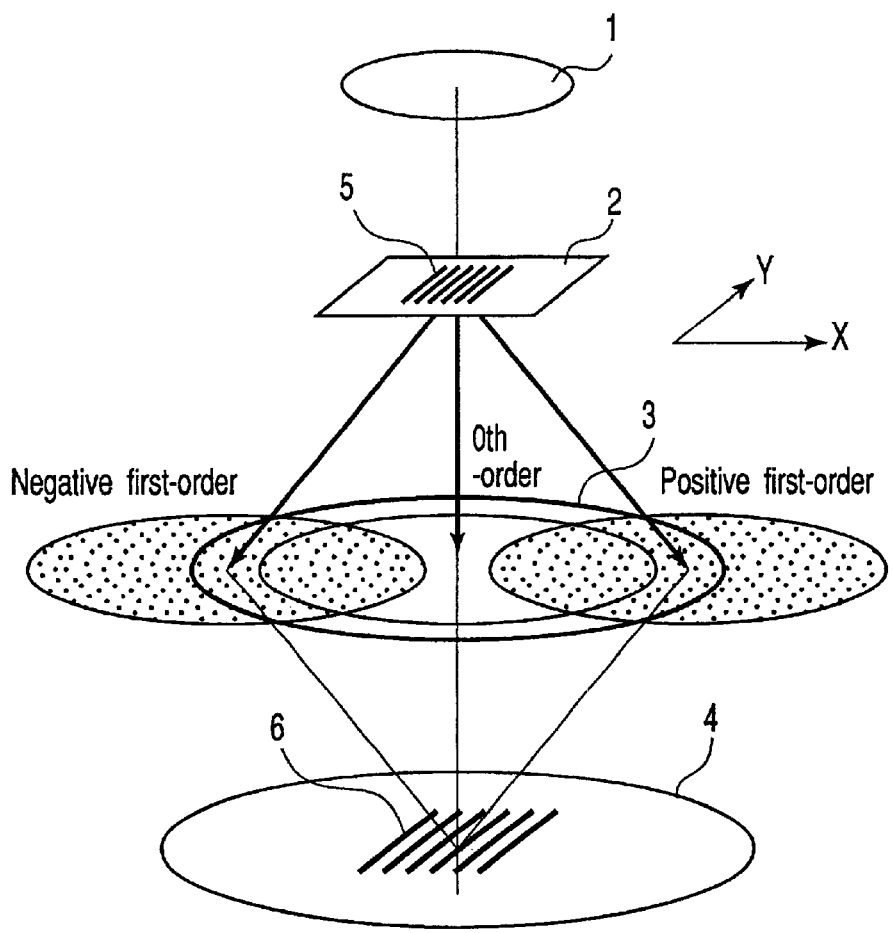
FIG. 1 shows a schematic illustration of a pattern on a photomask being transferred onto a wafer.

FIG. 1 is a schematic illustration of a pattern on a photomask being transferred onto a wafer by means of a demagnification projection type exposure apparatus which is used for manufacturing semiconductor devices.

Referring to FIG. 1, a lighting optical system 1 illuminates the mask pattern 5 formed on a photomask 2 and the rays of light diffracted by the mask pattern 5 are converged onto wafer 4 so that an image 6 of the mask pattern 5 is formed on the wafer 4.

A photo sensitizing agent such as photo resist is applied to the surface of the wafer 4 in advance. As the wafer that has been exposed to light is subjected to a developing process, an image 6 of the mask pattern 5, i.e. a resist pattern, is produced. As the image formed on the surface of the wafer 4 is defocused, the image of the mask pattern generally becomes blurred.

Figure 2A:
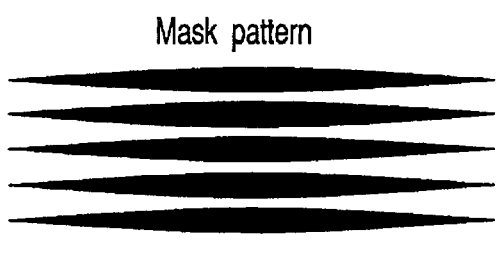
FIGS. 2A and 2B show schematic illustrations of a conventional focus measurement using an SMP mark.
Figure 2B:
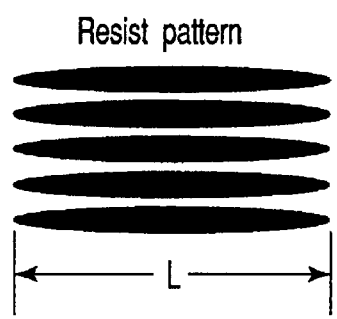

With the method of USP1, the amount of defocus of the image is transformed into a change of size of the resist pattern. FIGS. 2A and 2B are schematic illustrations of a mask pattern that is typically used with the method of USP1. As the rhombic mask pattern is exposed to light, the size L of the resist pattern is maximized at the best focus and reduced as a function of the amount of defocus. Therefore, the focus can be measured by observing the changes in the size L.

Figure 3A:
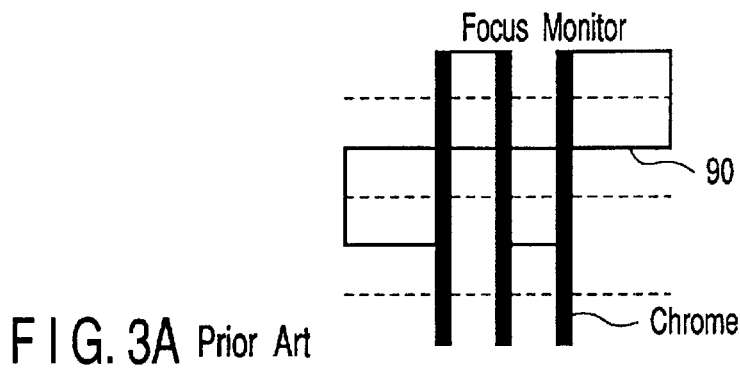
FIGS. 3A and 3B show simulation result showing the principle of a conventional focus measurement using a Levenson type phase shift mask.
Figure 3B:
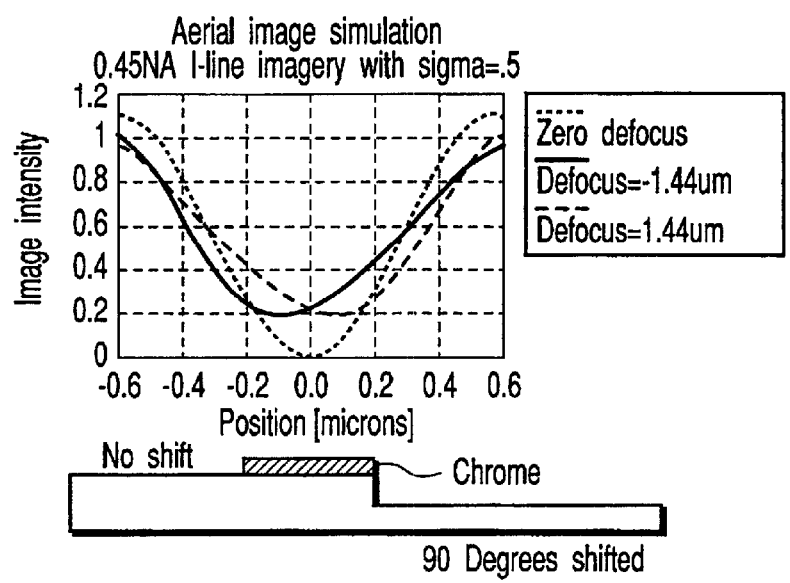

FIGS. 3A and 3B are schematic illustrations of the focus measuring method of USP2. Refer to Reference Document 1 [T. A. Brunner, et. al., Proc. SPIE 2197 (1994) p. 541–549] for detail.

Referring to FIGS. 3A and 3B, the mask pattern comprising isolated stripes (of chrome having a width of 0.4 $\mu$m) which are pinched at the opposite ends thereof by a transparent section and a 90° phase shifter. While the distribution of intensity of light of the mask pattern on the wafer is symmetrical at the best focus (zero-defocus), the minimal position is transversally shifted at a defocused. Thus, the defocus can be determined by observing the positional displacement of the resist pattern which is transferred the isolates stripe type pattern.

Figure 4:
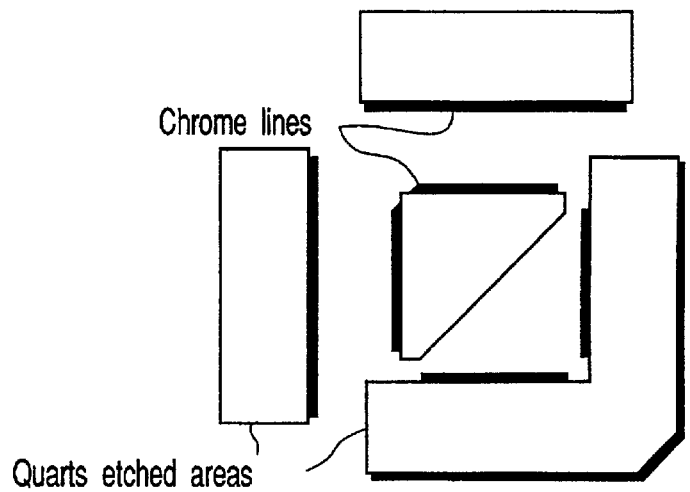
FIG. 4 shows a measurement mark for a conventional Levenson type phase shift mask.

FIG. 4 is a schematic illustration of a focus monitor mark on a mask that is provided on an assumption that the focus is automatically measured by an ordinary misalignment inspection apparatus. It will be appreciated that, as the width of each of the isolated stripes of the pattern of the focus monitor mark is reduced, the contrast is also reduced at a defocus, it makes difficult to form a clear resist pattern. If a resist pattern can be formed, it will be difficult for an ordinary misalignment inspection apparatus to accurately detect the positional displacement because of its low resolution. In short, the ordinary misalignment inspection apparatus for automatically detecting the focus operates only with a poor sensitivity.

Now, embodiments of the invention will be described by referring to the accompanying drawing.

1st Embodiment

Firstly, the first embodiment of the invention will be described. This embodiment is adapted to accurately quantify the amount of defocus by using an evaluation mask as a test mask for measuring a focus which includes a periodic pattern showing differentiated diffraction efficiencies for diffracted light of the positive first-order and that of the negative first-order (to be referred to as asymmetric diffraction grating pattern hereinafter) and a reference pattern, and measuring a relative distance of an image of the asymmetric diffraction grating pattern and a relative distance of an image of the reference pattern. The images of the patterns are projected on a test substrate which is hold on a stage of a projection-type exposure apparatus. The images of the patterns may be projected on an image detector provided on the stage instead of the test substrate. In this case, it does not need an optical microscope for observe the images of the patterns.

By using such the evaluation mask, it is possible to substantially reduce either diffracted light of the positive first-order or that of the negative first-order to nil and dramatically broaden the DOF (depth of focus) with which the resist pattern is formed. Additionally, not only a wide focus range of focus measurement but also high accuracy focus measurement can be performed, because the amount of defocus and the position displacement of the pattern show a linear relationship regardless of presence or absence of aberration.

Still additionally, the object under the measurement is a periodic pattern so that it is possible to observe a periodic pattern showing a pattern density similar to that of a pattern to be actually used for manufacturing semiconductor devices.

Figure 5A:
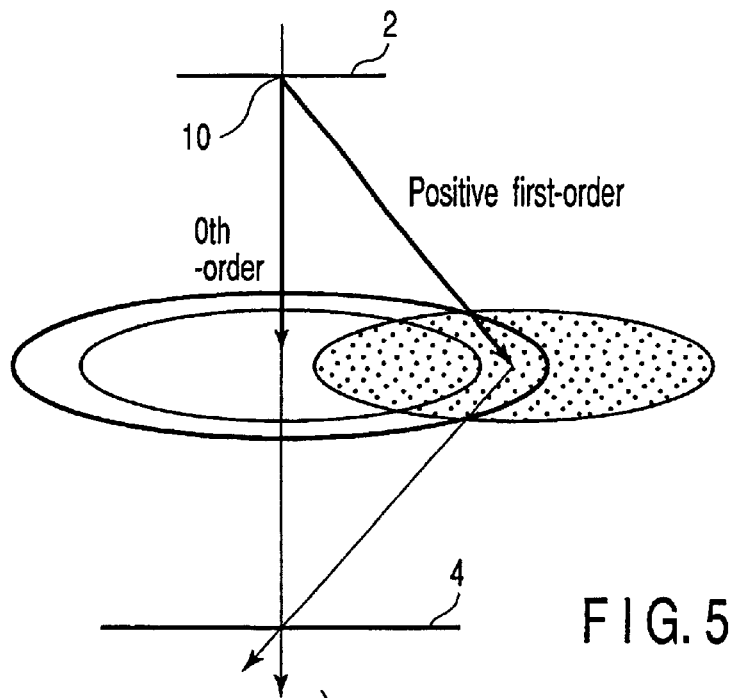
FIGS. 5A and 5B show schematic illustrations of a shift of stripes of a pattern of an asymmetric diffraction grating according to an embodiment of the invention relative to the focus.
Figure 5B:
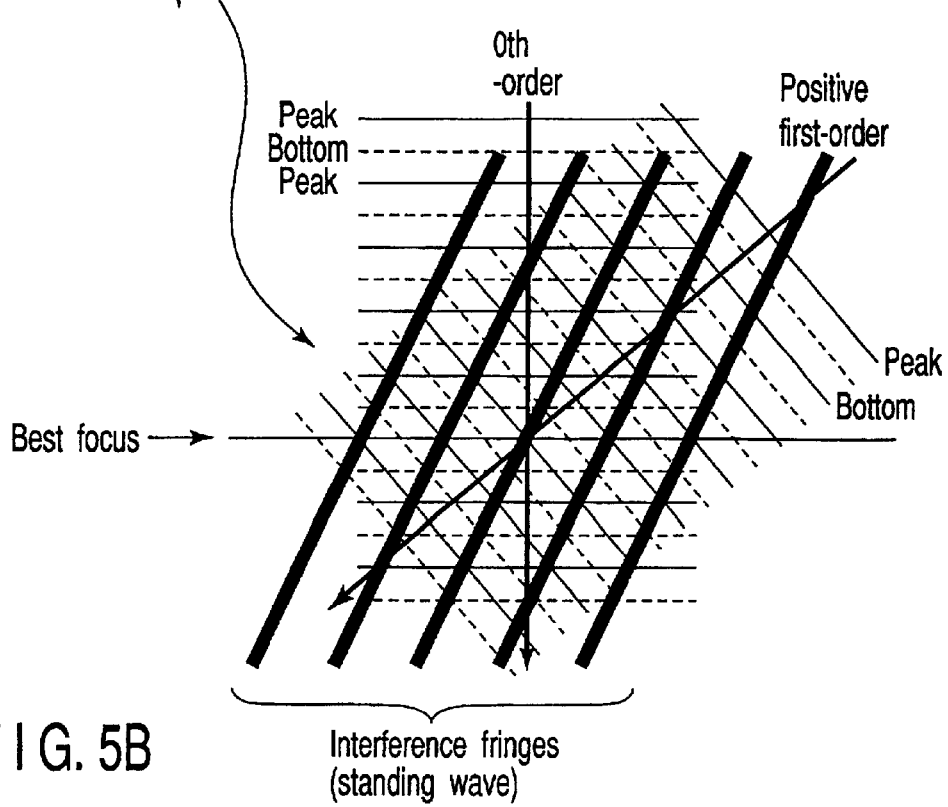

FIGS. 5A and 5B are schematic illustrations of an imaging obtained by using an ideal asymmetric diffraction grating pattern showing a diffraction efficiency of nil for diffracted light of the negative first-order.

As seen from FIGS. 5A and 5B, the diffracted light of the 0th-order and that of the positive first-order strength each other at peak and valley by the asymmetric diffraction grating pattern 10 to produce inclined interference fringes (a standing wave). The interference fringes shows a very broad DOF (depth of focus) compared with ordinary interference fringes produced by three fluxes of light (e.g., the DOF is theoretically as large as infinity when incident light is coherent) and an inclination found at the middle of the angle of incidence of light of the 0th-order and that of the positive first-order.

Therefore, as the wafer 4 is exposed with defocusing up or down, the position of the resist pattern formed on the wafer 4 shifts proportionally to the amount of defocus. Thus, it is no longer necessary to change the focus condition gradually and repeat an exposure process to observe a change of the size. In short, according to the embodiment of the invention, it is now possible to measure the amount of defocus with the proper (positive or negative) sign easily.

Figure 6:
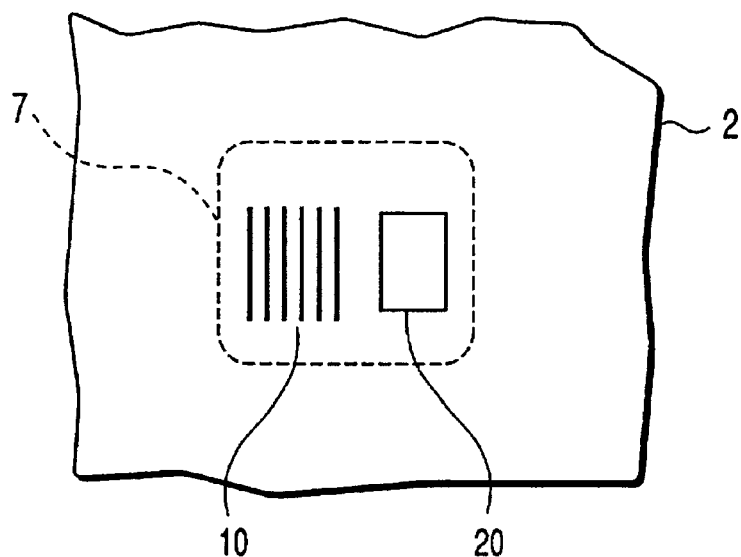
FIG. 6 shows a schematic illustration of a test mark according to an embodiment of the invention.

As shown in FIG. 6, the evaluation mask of this embodiment has a structure that an asymmetric diffraction grating pattern 10 and a reference pattern 20 are arranged on the photo mark 2 to measure the shift of the asymmetric diffraction grating due to defocus.

An asymmetric diffraction grating pattern used for a test of an exposure apparatus is already reported in Reference Document 2 [J. P. Kirk, C. J. Proler, Proc. SPIE 3679 (1999) p. 70–76].

The Reference Document 2 proposes the use of a diffraction grating pattern (asymmetric diffraction grating) showing a saw-teeth-like cross section for generating diffracted light of the positive first-order and that of the negative first-order with differentiated diffraction efficiencies respectively. According to the reference document 2, the diffraction grating pattern is exposed several times by gradually changing focus, concave and convex fringe formed on the surface of the resist is observed by using a dark-field microscope and the aberration of the projection optical system of the exposure apparatus is measured.

Figure 7:
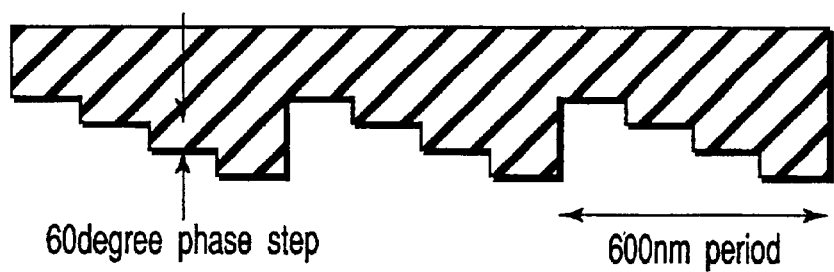
FIG. 7 shows a schematic cross sectional view of a conventional asymmetric diffraction grating.

However, in reality, since it is difficult to form a diffraction grating pattern showing a saw-teeth-shaped cross section, it is replaced by a diffraction grating pattern showing a stepped profile as illustrated in FIG. 7. Since it is difficult for such a diffraction grating pattern to obtain a sharp contrast over a broad DOF, it is difficult to prepare a resist pattern that is suitable to measuring the positional displacement.

So, it may be assumed that the undulations formed on the surface of the resist are quantified by means of a dark-field microscope. Therefore, the Reference Document 2 does not describe any reference pattern similar to the one used in this embodiment that is necessary for measuring the positional displacement.

The test mark for focus measurement according to the embodiment comprises a reference pattern that is necessary for measuring the positional displacement and an asymmetric diffraction grating pattern for causing shift of the image proportional to the focus.

FIGS. 8A–8H show plane views and cross section views of asymmetric diffraction grating patterns that can be applicable to an evaluation mask according to the embodiment of the invention.

Figure 8A:
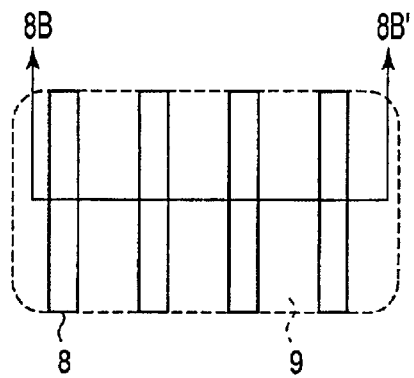
FIGS. 8A–8H show schematic views of a asymmetric diffraction grating patterns according to an embodiment of the invention.
Figure 8C:
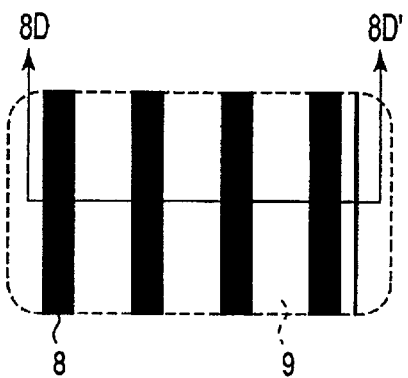
Figure 8B:
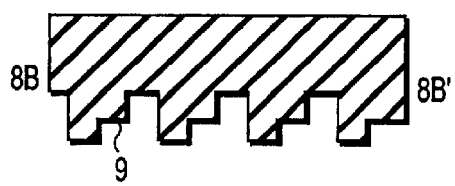

The asymmetric diffraction grating pattern of FIGS. 8A and 8B have a transmitting section 9 but does not have a light-shield section, i.e. all part of the asymmetric diffraction grating pattern is made of transparent material to the light. And the pattern is cut to show a saw-teeth-shaped profile. It is difficult for the pattern to obtain high contrast image because of lack of light-shield section. But the pattern is applicable by using high gamma resist that can capture the low contrast image of FIGS. 8A and 8B.

Figure 8D:
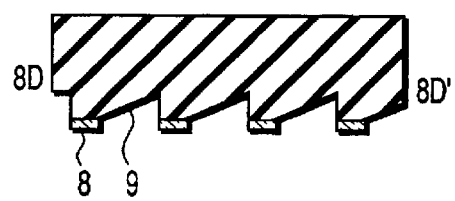
Figure 8E:
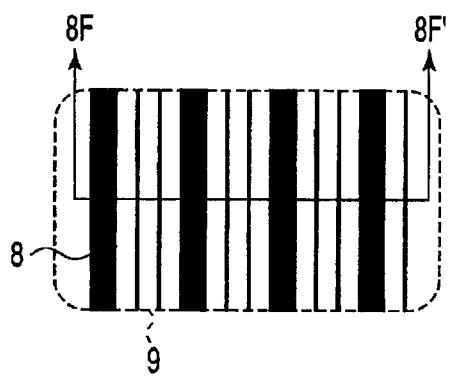
Figure 8G:
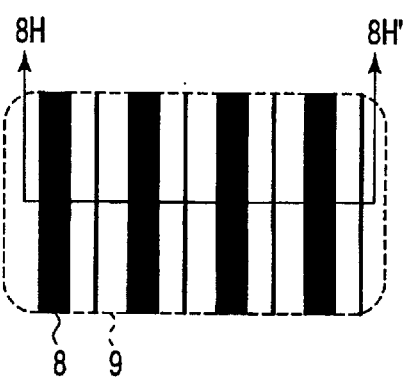
Figure 8F:
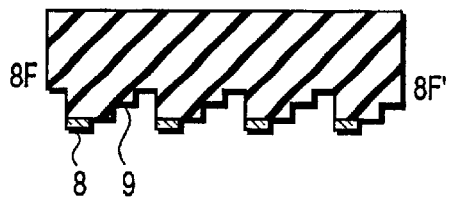
Figure 8H:
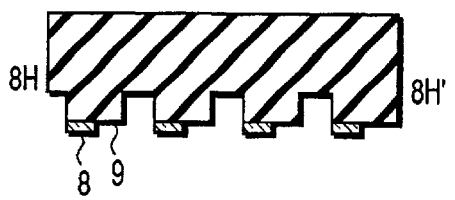

The asymmetric diffraction grating pattern of FIGS. 8C and 8D have a transmitting section 9 that is cut to show a saw-teeth-shaped profile. While such asymmetric diffraction grating patterns can theoretically conceivable, they are not realistic from the viewpoint of actual photomask manufacturing process (a quartz substrate processing). Further, the step structure described in the Reference Document 2, i.e. the structure shown in FIGS. 8E and 8F can be produced by conventional photomask manufacturing process and is realistic. FIGS. 8E and 8F show asymmetric diffraction grating pattern where the transmitting section 9 has a three-stepped profile. But FIG. 8C shows an asymmetric diffraction grating pattern having a transmitting section 9 with a two-stepped profile. Such a pattern can be manufactured most easily among the patterns.

Figure 9A:
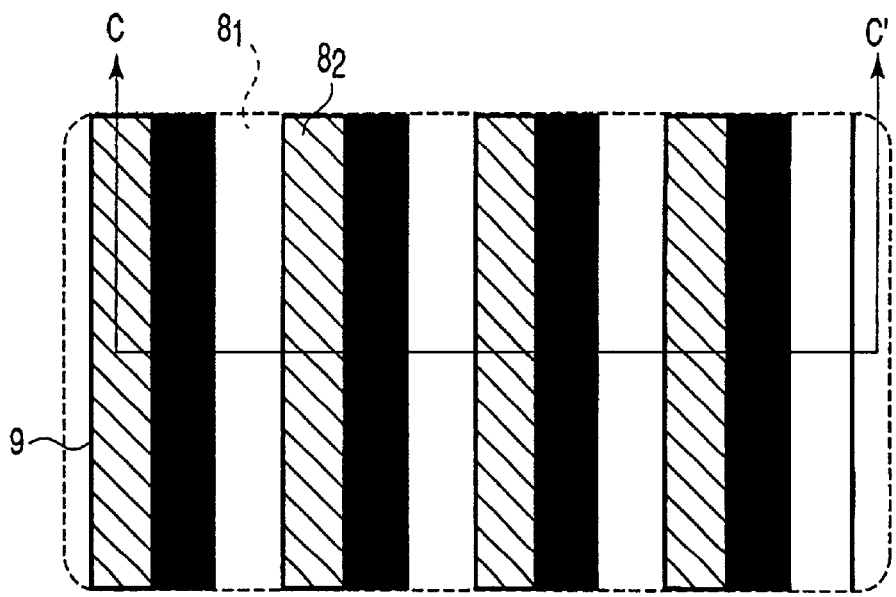
FIGS. 9A and 9B show schematic views for explanation of an asymmetric diffraction grating pattern according to an embodiment of the invention.
Figure 9B:
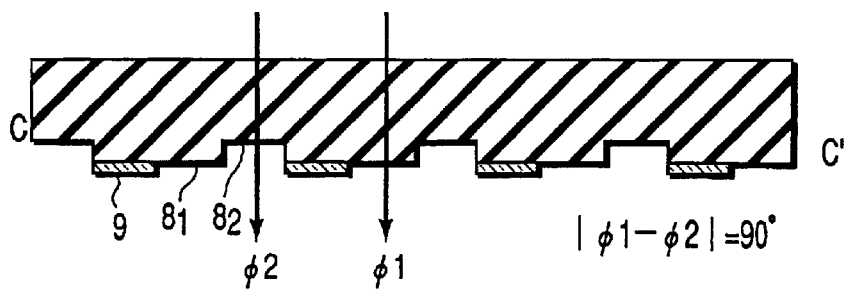

Additionally, as shown in FIGS. 9A and 9B, in order to differentiate the diffraction efficiency of diffracted light of the positive first-order and that of diffracted light of the negative first-order, the difference between the phase $\phi 1$ of light $11_1$ transmitted through transmitting section $8_1$ and the phase $\phi 2$ of light $11_2$ transmitted through transmitting section $8_2$ need to be equal to a value other than 180°, most preferably equal to $|\phi 1 - \phi 2| = 90°$.

Figure 10:
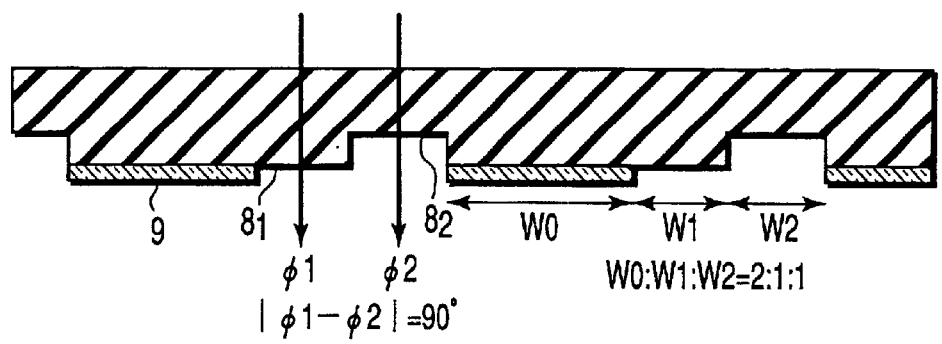
FIG. 10 shows a schematic cross sectional view for explanation of an asymmetric diffraction grating pattern according to an embodiment of the invention.
Figure 13A:
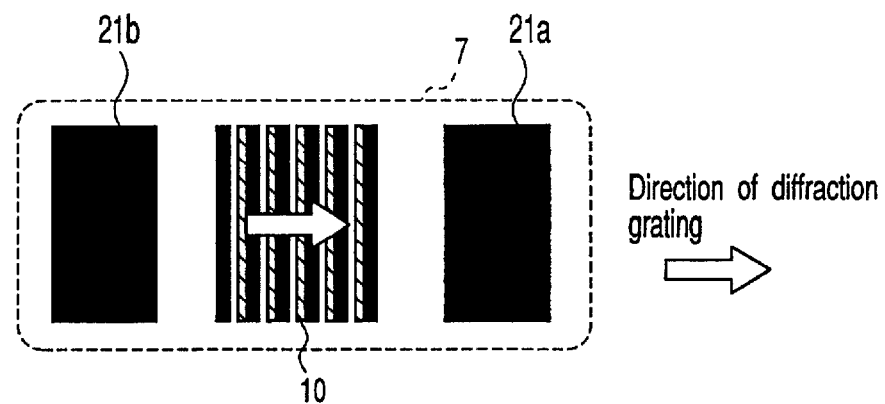
FIGS. 13A–13C show a test mark according to an embodiment of the invention.
Figure 13B:
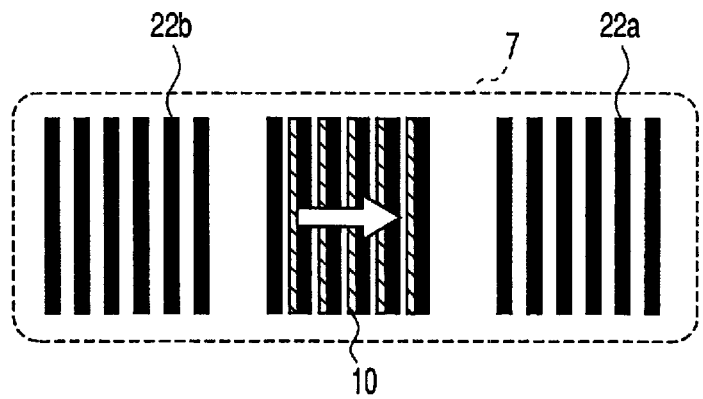
Figure 13C:
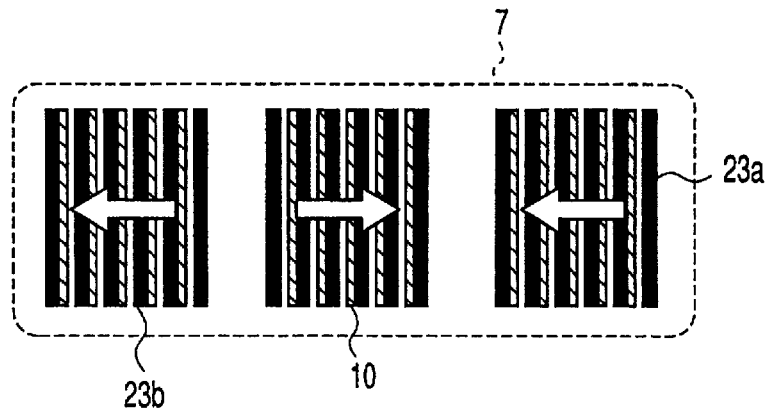

Furthermore, as shown in FIG. 10, when the stripe width W0 of the light-shield section, the stripe width W1 of the light transmitting section 81 and the stripe width W2 of the light transmitting section 82 show a ratio of W0:W1:W2=

2:1:1, either the diffraction efficiency of diffracted light of the positive first-order or that of diffracted light of the negative first-order (the latter in FIG. 10) can be substantially made equal to nil. So, an asymmetric diffraction grating pattern showing such a relationship is most preferably for the evaluation mask. Therefore, the asymmetric diffraction grating patterns that are described hereinafter are assumed to meet the requirements of $|\phi 1 - \phi 2|=90°$ and W0:W1:W2=2:1:1.

Now, the positional relationship between the asymmetric diffraction grating pattern and the reference pattern of the test mark of this embodiment will be described below.

As the reference pattern, mainly, three kinds of pattern shown in 12A–12C, i.e. a large isolated type pattern 21 shown in the FIG. 12A, a diffraction grating pattern 22 shown in the FIG. 12B, and an asymmetric diffraction grating pattern 23 that is oppositely directed relative to the asymmetric diffraction grating pattern 10 shown in the FIG. 12C can be proposed.

Since not only the asymmetric diffraction grating pattern 10 but also the isolated type pattern 21 of the test mark shown in FIG. 12A have a broad DOF, it can be used for measurements with a broad focus range. However, since the image of the asymmetric diffraction grating pattern 10 shifts not only by a defocused but also by the aberration of the projection optical system, a test mark that is transversally symmetric relative to the test mark of FIG. 12A needs to be measured at the same time in order to correct the influence of aberration.

The test mark 7 shown in the FIG. 12B uses a pattern whose period is same as the asymmetric diffraction grating pattern 10 as the diffraction grating pattern 22, by which the shifts of the both patterns due to the aberration becomes same, and remove influence of the aberration. However, the arrangement of FIG. 12B is accompanied by a problem that the DOF of the diffraction grating pattern 22 is inevitable relatively narrow.

The test mark 7 shown in the FIG. 12C not only avoid the above mentioned problems but double the shift of the image due to the defocus, and most preferably mark. Differently stated, it is a test mark that is free from the influence of aberration and provides a high optical sensitivity.

Figure 14A:
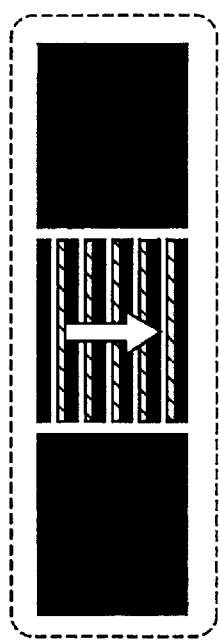
FIGS. 14A–14C show a test mark according to an embodiment of the invention.
Figure 14B:
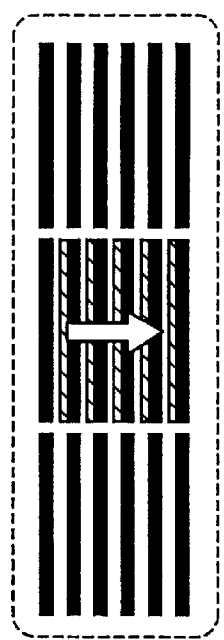
Figure 14C:
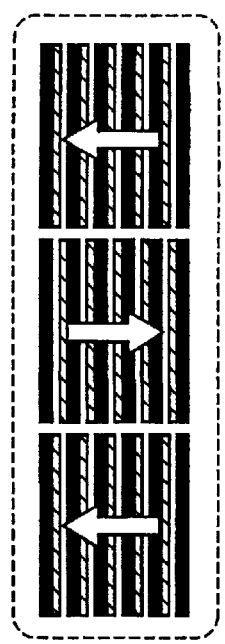

FIGS. 13A–13C and FIGS. 14A–14C show other test marks that are preferably designed to correct the measurement error attributable to the measuring apparatus. Test marks show an arrangement where an asymmetric diffraction grating pattern 10 is sandwiched between a pair of reference pattern (large isolated type patterns 21a, 21b, diffraction grating patterns 22a, 22b, asymmetric diffraction grating patterns 23a, 23b) or vice versa. In FIGS. 14A–14C and the succeeding figures, the patterns are illustrated without reference numerals unless necessary for the purpose of simplification.

Now, a measurement operation using a test mark which has the arrangement shown in FIG. 14C will be discussed below. The test mark shows a period of 0.13 $\mu$m. The widths of the strips are respectively W0=0.13 $\mu$m, W1=W2=0.065 $\mu$m. Note that the values of W0, W1 and W2 correspond respectively to the those converted on the wafer.

Figure 15A:
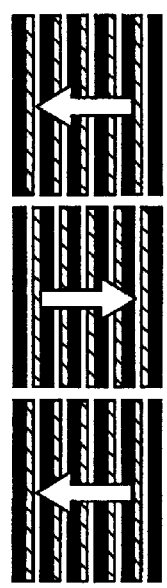
FIGS. 15A–15C show test marks and resist patterns transferred onto wafers according to the first embodiment of the invention.
Figures 15B, 15C:
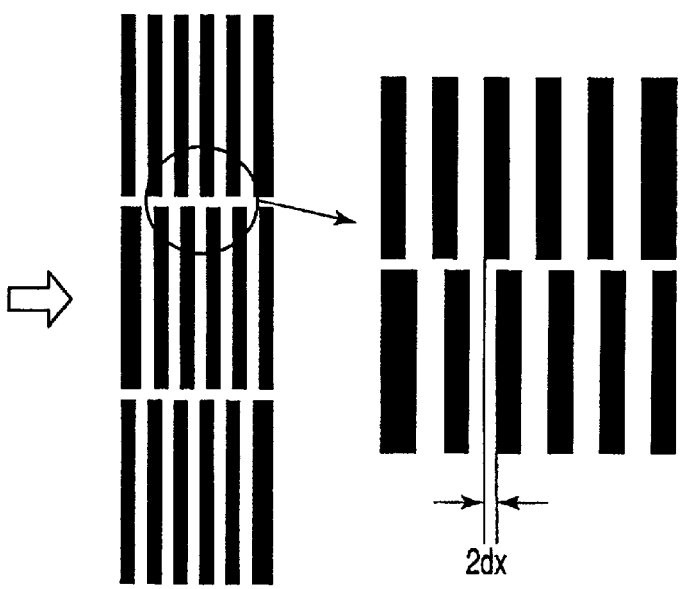

The resist patterns are formed by means of a KrF exposure apparatus with NA0.68. A ⅔ annular type stopper inspection is selected for lighting condition. FIGS. 15A–15C schematically illustrate the test mark on the photomask and the resist pattern transferred onto the wafer. FIG. 16 shows a graph illustrating the result obtained by simulation of the relationship between the focus and the pattern shift.

Referring to FIGS. 15A–15C, the shift dx of the resist pattern (pattern shift) is computationally determined to correspond to a defocus of 8.5 nm/0.1 $\mu$m. So, 2dx represents a quantity that can be satisfactorily detected by a scanning electron microscope. The aberration is not taken into consideration in the result of the simulation, and as a graph of FIG. 16 shows the result of the pattern shift is linearly proportional to the focus. While the entire graph may be shifted vertically or transversally when the aberration is taken into consideration for simulation, the linearity of the obtained graph is same as that of FIG. 16.

However, note that the image of the opposite ends of an asymmetric diffraction pattern is transversally asymmetric so that the measurement needs to be limited to the inner periodic patterns. Also note that the periodic patterns running in two different directions that intersect each other perpendicularly show best focuses that are displaced from each other due to the astigmatism of the projection optical system so that the test mark 7 preferably has closely located patterns running in two different directions that intersect each other as shown in FIG. 17.

As discussed above, by using the evaluation mask according to the embodiment as the test mark for measuring the focus, it allows to utilize the phenomenon that the image of the diffraction grating pattern (asymmetric diffraction grating pattern) that produce diffracted light of the positive first-order and that of the negative first-order which have different diffraction efficiencies respectively transversally shifts in proportion to the amount of defocus.

Then, as a result, by quantifying the amount of the transversal shift, specifically, by quantifying the amount of defocus based on the relative distance of the image of the asymmetric diffraction grating pattern and the image of the reference pattern, by which the periodic pattern showing a pattern density similar to that of a pattern to be actually used for manufacturing semiconductor devices can be observed and accurately measure the amount of defocus with the proper (negative or positive) sign.

2nd Embodiment

Now, an embodiment using a misalignment detector apparatus that is generally used for automatically determining the accuracy of alignment in a lithography process will be described below.

The misalignment inspection apparatus uses a measurement mark of the box-in-box type or the bars-in-bars type, captures an enlarged image of the measurement mark by means of an optical microscope, and measure a relative positional displacement of the inner pattern and the outer pattern automatically and accurately in a short period of time.

There have been reported many instances where such a apparatus is applied to the measurement of the comatic aberration of the projection optical system of an exposure apparatus. Particularly, USP3 [U.S. Pat. No. 6,011,611] proposes a method of measuring the shift of a periodic pattern due to the comatic apparatus.

Figure 18A:
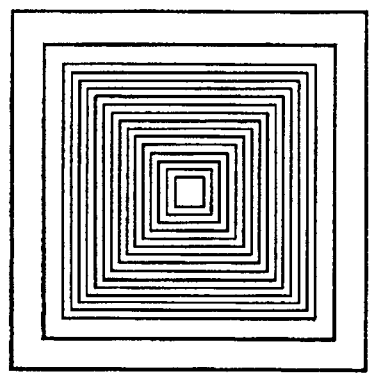
FIGS. 18A and 18B show a conventional mask pattern for measuring a comatic aberration.
Figure 18B:
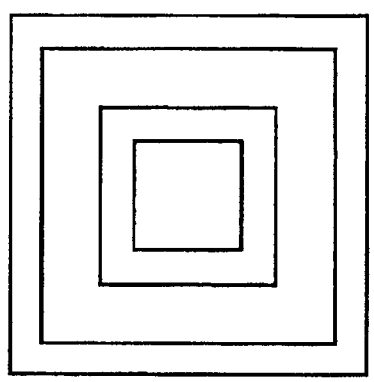
Figure 19A:
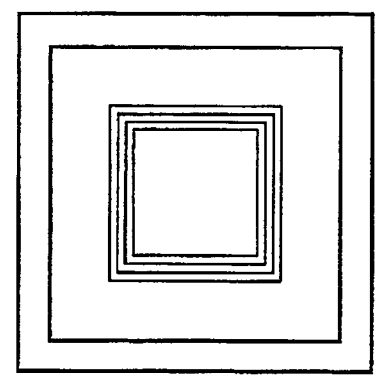
FIGS. 19A and 19B show a conventional resist pattern for measuring a coma aberration and an image observed by test instrument for detecting a misalignment.
Figure 19B:
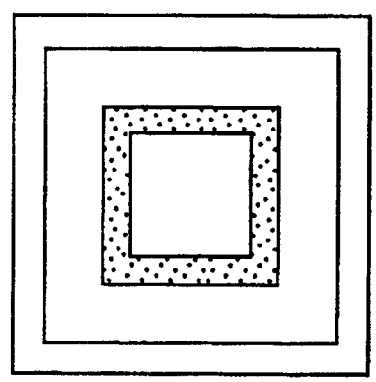

According to USP3, mask patterns as shown in FIGS. 18A and 18B are successively exposed to light to form a resist pattern as shown in FIG. 19A. Because the inner pattern of the resist pattern cannot be resolved by the magnifying microscope of the misalignment inspection apparatus, it is substantially recognized as a mark of the bar-in-bar type showing a different contrast level as shown in FIG. 19B, and the positional shift of the periodic pattern (inner image) due to the coma is measured by referring to the position of the outer pattern.

FIG. 20 shows a test pattern of a test mark for a focus measurement according to the embodiment. The pattern itself structurally resembles the known test marks of FIGS. 18A and 18B. However, the test marks of FIGS. 18A and 18B use a non-asymmetric diffraction grating pattern, while the test mark of FIG. 20 uses an asymmetric diffraction grating pattern 10, therefore, the test mark of FIG. 20 is intrinsically different from the test marks of FIGS. 18A and 18B.

Note that the asymmetric diffraction grating pattern 10 is divided into four regions, in each of which the diffraction grating is directed to the direction indicated by the arrow of the region. The asymmetric diffraction grating pattern 10 and a trim pattern are superposed and exposed to light to produce a pattern similar to those of FIGS. 19A and 19B and the position of the focus can be determined by observing the produced pattern. Generally, when superposing a trim pattern (test pattern) laid and an asymmetric diffraction grating pattern, and exposing the patterns to light, it is sufficient to cover a part of line group which comprises the image of the asymmetric diffraction grating pattern with an image of the trim pattern.

FIGS. 21A and 21B shows a test mark showing a doubled measuring sensitivity compared with the above described test mark. The asymmetric diffraction grating pattern 10 of this test mark 7 is divided into eight regions as shown in FIG. 21B, in each of which the diffraction grating is directed to the direction indicated by the arrow of the region. This asymmetric diffraction grating pattern 10 provides an advantage that it is not affected by the comatic aberration.

In present embodiment, the measurement at a single point on the wafer is described, it may be needless to say that a measurement of a curvature of the image plane can be performed highly accurately by arranging a plurality of such test marks in an area to be exposed to light.

3rd Embodiment

This embodiment relates to a method for measuring an aberration of an even function of a projection optical system by applying the method for measuring the focus according to the embodiment of the invention.

A method for measuring the aberration by utilizing the interference of three fluxes of light caused by a diffraction grating pattern is known (e.g., one described in Jpn. Pat. Appln. KOKAI Publication No. 11-237310).

In the above method, a periodic pattern is transferred onto a wafer under the condition where the value of σ of the lighting optical system is made small so that diffracted light of the 0th-order, that of the positive first-order and that of the negative first-order may be allowed to pass through just inside of NA of the projection optical system and the method of USP3 is applied to the measurement of the odd function aberration such as coma, while the method of Reference Document 3 [J. P. Kirk, Proc. SPIE 1463 (1991) p. 282–291] is applied to the measurement of the even function aberration such as astigmatism. In other words, a micro-step exposure process of gradually displacing the focus is performed, the position of the best focus is detected out of the dark field image of an optical microscope and the astigmatism is determined from the relationship between the direction of the pattern and the position of the best focus.

Figure 22A:
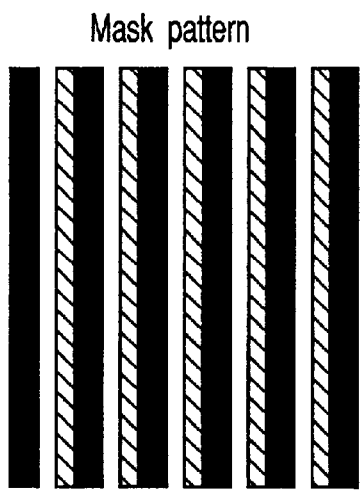
FIGS. 22A and 22B show a definition of pattern period P according to an embodiment of the invention.
Figure 22B:
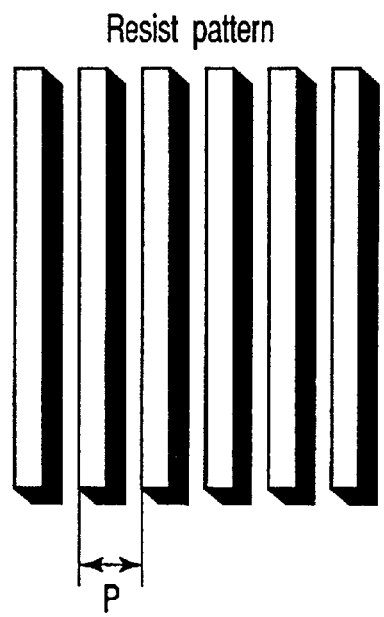

In this embodiment, the above described evaluation mask (test mark) of the embodiment is used to determine the position of the best focus to be used for measuring the even function aberration. This embodiment using such a test mark does not require any micro-step exposure process (where operations of exposure to light are conducted successively for tens of several times while changing the position of the focus little by little at any time). Therefore, the influence of the fluctuation that relates control of focus or the light quantity of the exposure of the apparatus is removed, and it makes possible to accurately measure the odd function aberration. Note that the pattern period P is defined by the period of the resist pattern transferred onto the wafer as shown in FIGS. 22A and 22B.

Figure 23A:
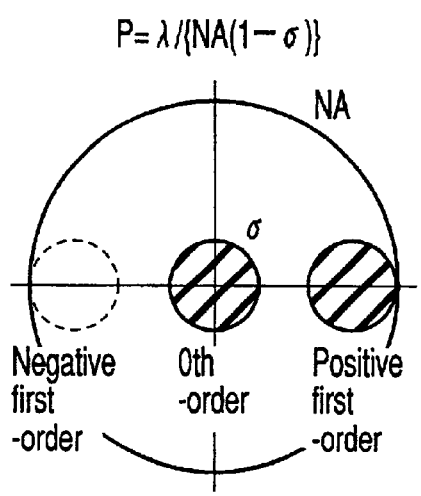
FIGS. 23A and 23B show schematic illustrations of the positional relationship between the pattern period P according to an embodiment of the invention and a diffracted light on a pupil of an eye.
Figure 23B:
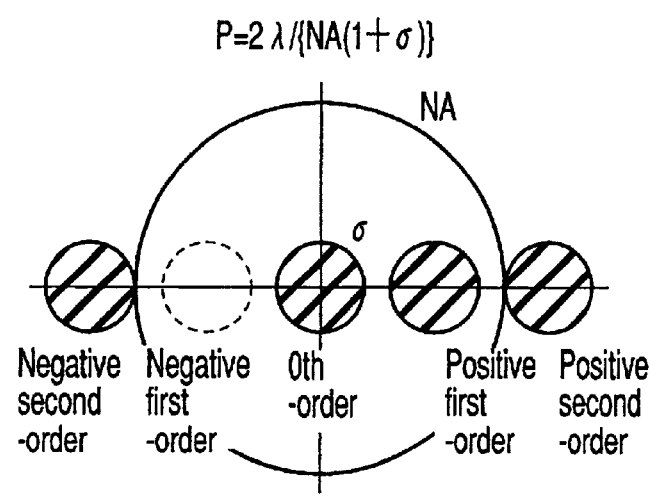

As shown in FIGS. 23A and 23B, diffracted light of the positive first-order is partly eliminated by the NA when $P<\lambda/\{NA(1-\sigma)\}$, whereas diffracted light of the positive and negative second-orders enter the inside of the NA when $P>2\lambda/\{NA(1+\sigma)\}$. Therefore, it is need to satisfy following formula (1) for performing quantitatively measurement of the aberration;

$$\lambda/\{NA(1-\sigma)\} \leq P \leq 2\lambda/\{NA(1+\sigma)\} \qquad (1),$$

where σ is the partial coherence of the lighting optical system for lighting the test mark, P is the period of the image of the first pattern of the test mark, λ0 is the wavelength of light of the lighting optical system and NA is the numerical aperture of the projection optical system.

Figure 24:
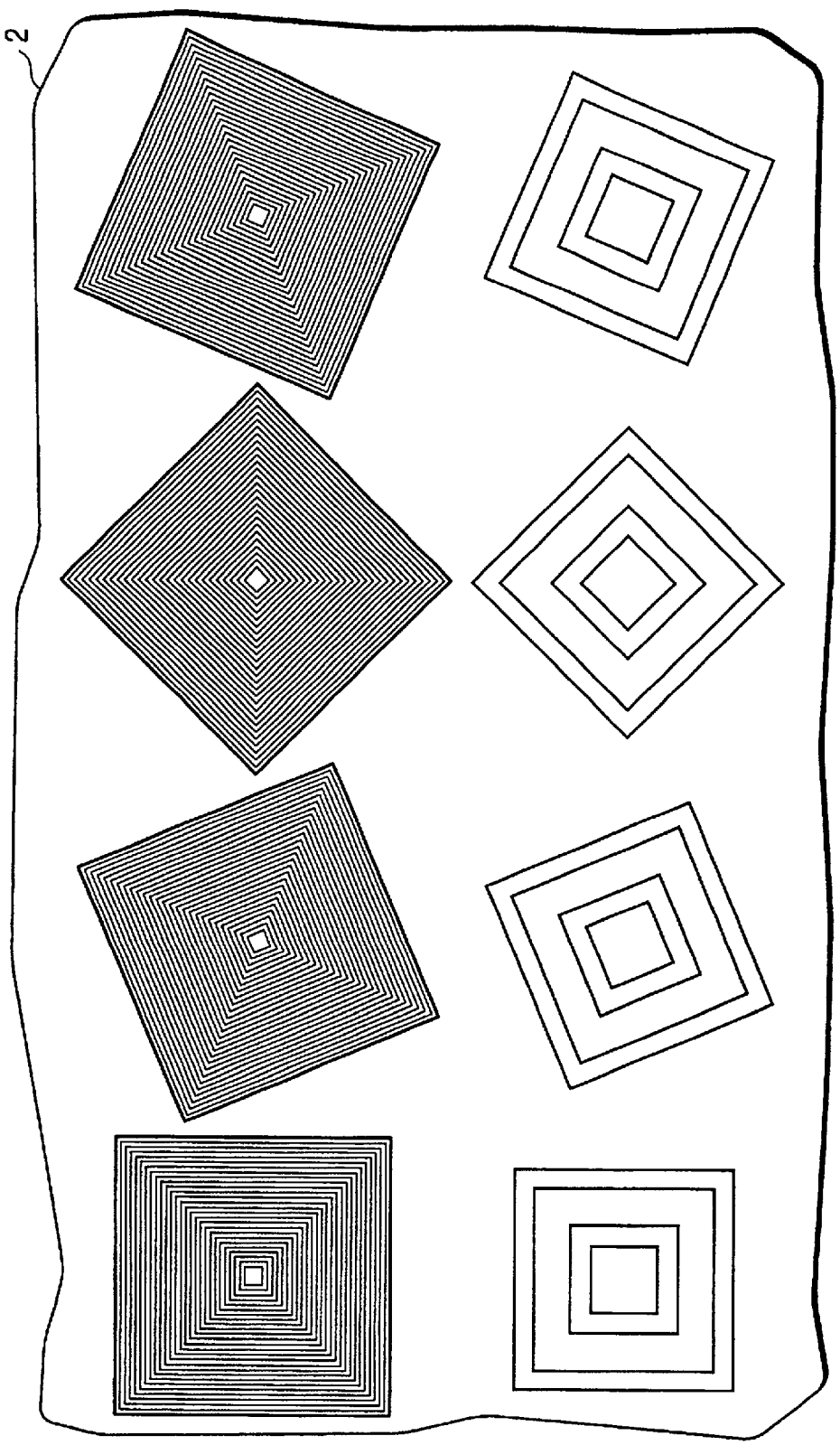
FIG. 24 shows a test mark for measuring the even function aberration according to the third embodiment of the invention.

For measuring the astigmatism, not only a test mark including a pair of an asymmetric diffraction grating pattern and a reference pattern as shown in FIGS. 21A and 21B but also a test mark obtained by tilting the test mark by 45° are required. For measuring the four-foil aberration (odd function aberration) of a higher order, a total of four test marks that are inclined by 22.5° relative to each other and arranged close to each other as shown in FIG. 24 are required.

While this embodiment is described above only in terms of astigmatism and four-foil aberration, it may be needless to say that the spherical aberration can be determined highly accurately by preparing a plurality of mask patterns satisfying the requirement of (formula 1) and measuring the relationship between the pattern period and the position of the best focus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An evaluation mask for evaluating a projection-type exposure apparatus, the mask comprising:

at least one diffraction grating pattern for producing a diffracted light of the positive first-order and a diffracted light of negative first-order, diffraction efficiencies of the diffracted lights being different respectively, one of the diffracted lights having a magnitude that is substantially zero, and an image of the at least one diffraction grating pattern being projected onto a test substrate or an image detector by the projection-type exposure apparatus; and a reference pattern for obtaining a reference image to measure a displacement of the image of the at least one diffraction grating pattern, and an image of the reference pattern being projected onto the test substrate or the image detector by the projection-type exposure apparatus, wherein the images of the at least one diffraction grating pattern and the reference pattern projected onto the test substrate or the image detector are used for evaluating the projection-type exposure apparatus.

2. The evaluation mask according to claim 1, wherein
the reference pattern includes a diffraction grating pattern that is symmetric relative to the diffraction grating pattern.

3. The evaluation mask according to claim 1, wherein
the reference pattern includes a first reference pattern and a second reference pattern and the at least one diffraction grating pattern is arranged between the first reference pattern and the second reference pattern.

4. The evaluation mask according to claim 1, wherein
the at least one diffraction grating pattern include a first diffraction grating pattern and a second diffraction grating pattern, and the reference pattern is arranged between the first diffraction grating pattern and the second diffraction grating pattern.

5. The evaluation mask according to claim 1, wherein
the at least one diffraction grating pattern include a first diffraction grating pattern and a second diffraction grating pattern, and the reference pattern includes a first reference pattern and a second reference pattern; and
the first diffraction grating pattern and the first reference pattern being arranged in parallel with each other on a first straight line, the second diffraction grating pattern and the second reference pattern being arranged in parallel with each other on a second straight line running perpendicularly relative to the first straight line.

6. The evaluation mask according to claim 1, further comprising:
a trim pattern; and
a part of the group of line pattern which comprises the image of the at least one diffraction grating pattern being covered with the image of the trim pattern when the trim pattern and the diffraction grating pattern are exposed to light and images of the trim pattern and the at least one diffraction grating pattern are superposed.

7. The evaluation mask according to claim 1, wherein
a plurality of pairs of the at least one diffraction grating pattern and the reference pattern are arranged rotationally at every 45° or 22.5°.

8. The evaluation mask according to claim 1, wherein
the diffraction grating pattern includes a light-shield section for shielding light and first and second transparent sections for transmitting light; and
the absolute value of the difference between a phase of light transmitted through the first transparent section and a phase of light transmitted through the second transparent section being other than 180°.

9. The evaluation mask according to claim 8, wherein
the absolute value is equal to 90°.

10. An evaluation mask according to claim 9, wherein
the ratio of the width of the light-shield section, the width of the first transparent section and the width of the second transparent section is substantially 2:1:1.

11. An evaluation mask for evaluating a projection-type exposure apparatus, the mask comprising:
at least one diffraction grating pattern for producing a diffracted light of the positive first-order and a diffracted light of negative first-order, diffraction efficiencies of the diffracted lights being different respectively, one of the diffracted lights having a magnitude that is substantially zero, the at least one diffraction grating pattern comprising a light-shield section for shielding light and first and second transparent sections for transmitting light, the absolute value of the difference between a phase of light transmitted through the first transparent section and a phase of light transmitted through the second transparent section being 90°, and an image of the at least one diffraction grating pattern being projected onto a test substrate or an image detector by the projection-type exposure apparatus; and
a reference pattern for obtaining a reference image to measure a displacement of the image of the at least one diffraction grating pattern, and an image of the reference pattern being projected onto the test substrate or the image detector by the projection-type exposure apparatus,
wherein the images of the at least one diffraction grating pattern and the reference pattern projected onto the test substrate or the image detector are used for evaluating the projection-type exposure apparatus.

12. A focus measuring method for measuring a defocus of an image of a test mark formed on a focus test mark projected on a substrate, the image being projected by a projection-type exposure apparatus, the projection-type exposure apparatus projecting an image of a mask pattern formed in a photo mask onto the substrate by way of a projection optical system comprising:
preparing an evaluation mask as the focus test mark, the evaluation mask comprising: at least one diffraction grating pattern for producing a diffracted light of the positive first-order and a diffracted light of negative first-order, diffraction efficiencies of the diffracted lights being different respectively, one of the diffracted lights having a magnitude that is substantially zero, and a reference pattern for obtaining a reference image to measure a displacement of the image of the at least one diffraction grating pattern,
preparing a substrate with a photo sensitizing material;
exposing the image of the diffraction grating pattern and the image of the reference pattern onto the substrate simultaneously, the diffraction grating pattern and the reference pattern comprising a test mark in the evaluation mask;
exposing an image of a trim pattern onto the substrate if the trim pattern exists in the evaluation mask; and
measuring the relative distance of the image of the diffraction grating pattern formed on the substrate and the image of the reference image formed on the substrate.

13. The focus measuring method according to claim 12, wherein
the reference pattern is a diffraction grating pattern that is symmetric relative to the diffraction grating pattern.

14. The focus measuring method according to claim 12, wherein
the reference pattern includes a first reference pattern and a second reference pattern and the at least one diffraction grating pattern is arranged between the first reference pattern and the second reference pattern.

15. The focus measuring method according to claim 12, wherein
the at least one diffraction grating pattern include a first diffraction grating pattern and a second diffraction grating pattern and the reference pattern is arranged between the first diffraction grating pattern and the second diffraction grating pattern.

16. The focus measuring method according to claim 12, wherein
the at least one diffraction grating pattern include a first diffraction grating pattern and a second diffraction grating pattern and the reference pattern includes a first reference pattern and a second reference pattern; and
the first diffraction grating pattern and the first reference pattern being arranged in parallel with each other on a first straight line, the second diffraction grating pattern and the second reference pattern being arranged in parallel with each other on a second straight line running perpendicularly relative to the first straight line.

17. A focus measuring method for measuring a defocus of an image of a test mark formed on a focus test mark projected on a substrate, the image being projected by a projection-type exposure apparatus, the projection-type exposure apparatus projecting an image of a mask pattern formed in a photo mask onto the substrate by way of a projection optical system comprising:
preparing an evaluation mask as the focus test mark, the evaluation mask comprising: at least one diffraction grating pattern for producing a diffracted light of the positive first-order and a diffracted light of negative first-order, diffraction efficiencies of the diffracted lights being different respectively, one of the diffracted lights having a magnitude that is substantially zero, and a reference pattern for obtaining a reference image to measure a displacement of the image of the at least one diffraction grating pattern; and
measuring the relative distance of the image of the diffraction grating pattern formed on the substrate and the image of the reference image formed on the substrate.

18. A focus measuring method for measuring a defocus of an image of a test mark formed on a focus test mark projected on a substrate, the image being projected by a projection-type exposure apparatus, the projection-type exposure apparatus projecting an image of a mask pattern formed in a photo mask onto the substrate by way of a projection optical system comprising:
preparing an evaluation mask as the focus test mark, the evaluation mask comprising at least one diffraction grating pattern for producing a diffracted light of the positive first-order and a diffracted light of negative first-order, diffraction efficiencies of the diffracted lights being different respectively, one of the diffracted lights having a magnitude that is substantially zero, the at least one diffraction grating pattern comprising a light-shield section for shielding light and first and second transparent sections for transmitting light, the absolute value of the difference between a phase of light transmitted through the first transparent section and a phase of light transmitted through the second transparent section being 90°, and a reference pattern for obtaining a reference image to measure a displacement of the image of the at least one diffraction grating pattern; and
measuring the relative distance of the image of the diffraction grating pattern formed on the substrate and the image of the reference image formed on the substrate.

19. An aberration measuring method for measuring an aberration of a projection-type exposure apparatus based on a defocus of an image of a test mark formed on a focus test mark projected on a substrate, the image being projected by the projection-type exposure apparatus, the projection-type exposure apparatus projecting an image of a mask pattern formed in a photo mask onto the substrate by way of a projection optical system comprising:
preparing an evaluation mask as the focus test mark, the evaluation mask comprising: at least one diffraction grating pattern for producing a diffracted light of the positive first-order and a diffracted light of negative first-order, diffraction efficiencies of the diffracted lights being different respectively, one of the diffracted lights having a magnitude that is substantially zero, and a reference pattern for obtaining a reference image to measure a displacement of the image of the at least one diffraction grating pattern,
preparing a substrate with a photo sensitizing material;
exposing the image of the diffraction grating pattern and the image of the reference pattern onto the substrate simultaneously, the diffraction grating pattern and the reference pattern comprising a test mark in the evaluation mask under the condition of $$\lambda/\{NA(1-\sigma)\} \leq P \leq 2\lambda/\{NA(1+\sigma)\},$$

where σ is a partial coherence of a lighting optical system for lighting the test mark, P is a period of the image of the first pattern of the test mark, λ is the wavelength of light of the lighting optical system and NA is a numerical aperture of the projection optical system;
exposing an image of a trim pattern onto the substrate if the trim pattern exists in the evaluation mask; and
measuring the relative distance of the image of the diffraction grating pattern formed on the substrate and the image of the reference image formed on the substrate.

20. An aberration measuring method according to claim 19, wherein
the reference pattern is a diffraction grating pattern that is symmetric relative to the diffraction grating pattern.

21. An aberration measuring method according to claim 19, wherein
the reference pattern includes a first reference pattern and a second reference pattern and the diffraction grating pattern is arranged between the first reference pattern and the second reference pattern.

22. An aberration measuring method according to claim 19, wherein
the diffraction grating pattern include a first diffraction grating pattern and a second diffraction grating pattern and the reference pattern is arranged between the first diffraction grating pattern and the second diffraction grating pattern.

23. An aberration measuring method according to claim 19, wherein
the diffraction grating pattern include a first diffraction grating pattern and a second diffraction grating pattern and the reference pattern includes a first reference pattern and a second reference pattern; and
the first diffraction grating pattern and the first reference pattern being arranged in parallel with each other on a first straight line, the second diffraction grating pattern and the second reference pattern being arranged in parallel with each other on a second straight line running perpendicularly relative to the first straight line.

* * * * *